(12) United States Patent
Song et al.

(10) Patent No.: US 7,491,997 B2
(45) Date of Patent: Feb. 17, 2009

(54) MEMORY DEVICE AND METHOD OF MANUFACTURING THE SAME

(75) Inventors: In-jae Song, Gyeonggi-do (KR); Won-joo Kim, Gyeonggi-do (KR); Sun-ae Seo, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/002,812

(22) Filed: Dec. 3, 2004

(65) Prior Publication Data
US 2005/0145896 A1      Jul. 7, 2005

(30) Foreign Application Priority Data
Dec. 12, 2003   (KR)   ................... 10-2003-0090552

(51) Int. Cl.
  *H01L 29/76* (2006.01)
(52) U.S. Cl. ........................ 257/314; 438/257
(58) Field of Classification Search ............. 257/327, 257/324, 314, 326, E29.309; 438/201, 211, 438/257
See application file for complete search history.

(56) References Cited

U.S. PATENT DOCUMENTS

| 3,793,090 | A | * | 2/1974 | Barile et al. ................. 438/591 |
|---|---|---|---|---|
| 3,882,469 | A | * | 5/1975 | Gosney, Jr. .................. 365/184 |
| 5,966,603 | A | | 10/1999 | Eitan |
| 6,271,094 | B1 | | 8/2001 | Boyd et al. |
| 6,388,293 | B1 | * | 5/2002 | Ogura et al. ................ 257/365 |
| 6,465,837 | B1 | | 10/2002 | Wu |
| 6,610,586 | B1 | * | 8/2003 | Liu ........................... 438/526 |
| 6,900,098 | B1 | * | 5/2005 | Ogura et al. ................ 438/257 |
| 2003/0094647 | A1 | * | 5/2003 | Osabe et al. ................ 257/314 |

FOREIGN PATENT DOCUMENTS

EP     1 041 642 A1    10/2000

OTHER PUBLICATIONS

Second Office Action issued in Chinese Patent Application No. 2004100983589 on Jul. 27, 2007, with English Translation.

* cited by examiner

*Primary Examiner*—David Vu
(74) *Attorney, Agent, or Firm*—Buchanan Ingersoll & Rooney PC

(57) ABSTRACT

A memory device and a method of fabricating the same are provided. The method includes forming a gate stack on a semiconductor substrate and partially exposing upper end portions of the semiconductor substrate by etching the gate stack to form a gate stack structure, and implanting a dopant into the exposed portions of the semiconductor substrate to form source and drain regions, wherein the gate stack structure is etched such that its width increases from top to bottom. Accordingly, it is possible to manufacture a memory device with high integration, using a simplified manufacture process.

20 Claims, 8 Drawing Sheets

MEMORY DEVICE AND METHOD OF MANUFACTURING THE SAME

BACKGROUND OF THE DISCLOSURE

Priority is claimed to Korean Patent Application No. 2003-90552 filed on Dec. 12, 2004 in the Korean Intellectual Property Office, the disclosure of which is incorporated herein in its entirety by reference.

1. Field of the Disclosure

The present disclosure relates to a memory device and a method of manufacturing the same, and more particularly, to a memory device and a method of manufacturing the same using a simplified process of making source and drain regions, thereby increasing the yield and performance of the memory device.

2. Description of the Related Art

The storage capacity of a semiconductor memory device is determined by the degree of integration that represents the number of memory cells per unit area. In general, a semiconductor memory device includes a plurality of memory cells that are connected via circuits. For instance, a memory cell of a dynamic random access memory (DRAM) is comprised of a transistor and a capacitor. Accordingly, it is required to reduce the size of the transistor and the capacitor so as to increase the integration of the semiconductor memory device.

The integration of the semiconductor memory device is closely related to a design rule applied to a manufacture process thereof. Thus, a stricter design rule must be applied to the manufacture process so as to increase the integration of the semiconductor memory device. In other words, since a process margin for a photolithography process or an etching process is insufficient, more precision for this process is required to manufacture a semiconductor memory device.

In this connection, new types of semiconductor memory devices that include a data storage device, such as a giant magneto resistance (GMR) structure or a tunneling magneto resistance (TMR) structure on a transistor, have been developed. The GMR and TMR structures are data storage devices that are differentiated from a capacitor of a conventional semiconductor memory device.

A polysilicon-oxide-nitride-oxide-silicon (SONOS) memory device is one of the new types of semiconductor memory devices. FIGS. 1A through 1H illustrate a conventional method of fabricating the SONOS memory device.

Figure 1A:
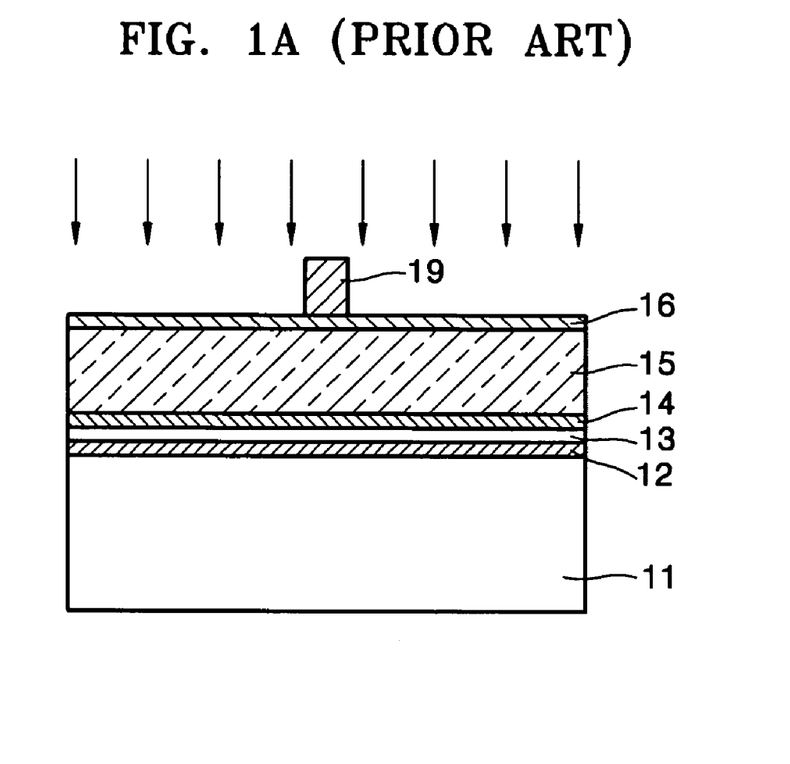
FIGS. 1A through 1H are diagrams illustrating a conventional method of fabricating a memory device.
Figure 1B:
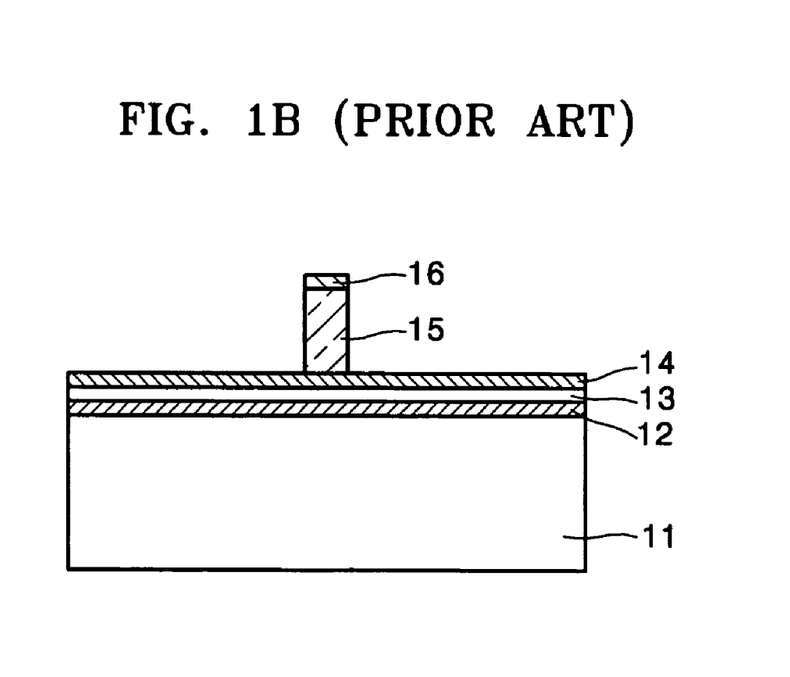
Figure 1C:
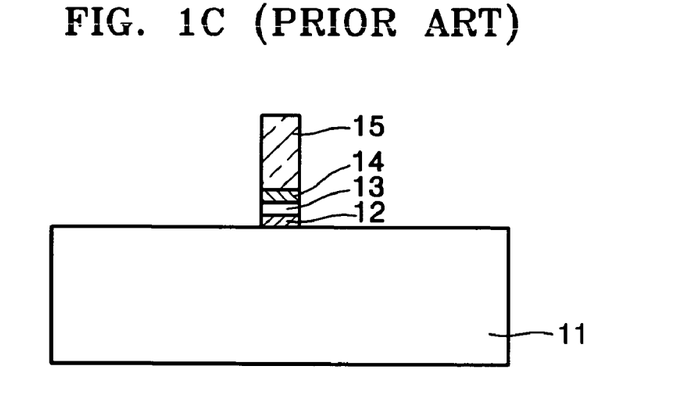

Referring to FIG. 1A, a tunneling oxide layer 12, a nitride layer 13, a blocking oxide layer 14, and a gate electrode layer 15 are sequentially deposited on a semiconductor substrate 11, thus forming a gate stack structure. In this disclosure, the tunneling oxide layer 12, the nitride layer 13, and the blocking oxide layer 14 will be referred to as an oxide-nitride-oxide (ONO) layer. The ONO layer, which is a gate stack structure, must be etched to obtain source and drain regions 17a and 17b (refer to FIG. 1F) and a gate structure. For etching, a mask layer 16 and an electron beam resist 19 are sequentially applied onto a resultant structure, and the electron beam resist 19 is patterned, as shown in FIG. 1A. Next, the mask layer 16 and the gate electrode layer 15 are etched to obtain the structure of FIG. 1B. Next, the ONO layer is etched and the electron beam resist 19 is removed, thus obtaining the gate structure of FIG. 1C.

Figure 1D:
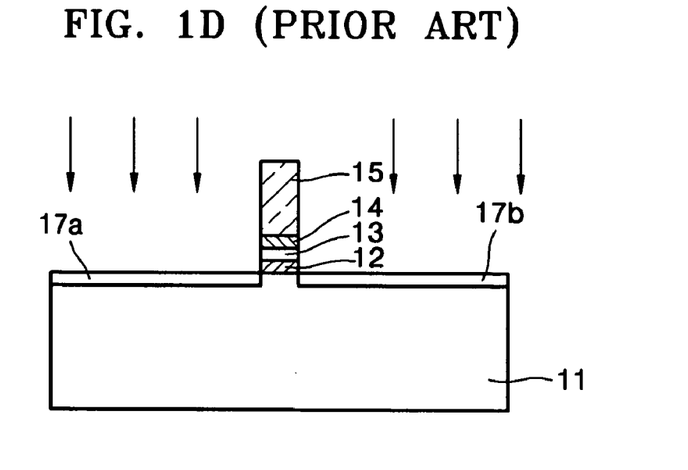

Next, as shown in FIG. 1D, an n-type dopant is implanted into the semiconductor substrate 11 to form the source and drain regions 17a and 17b. In this case, it is important to precisely control the concentration and thickness of the n-type dopant to prevent channel regions under the tunneling oxide layer 12 from being doped with the n-type dopant.

Figure 1E:
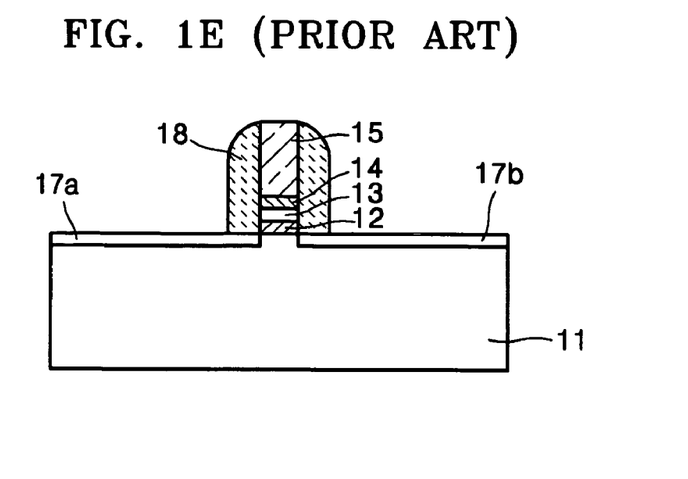
Figure 1F:
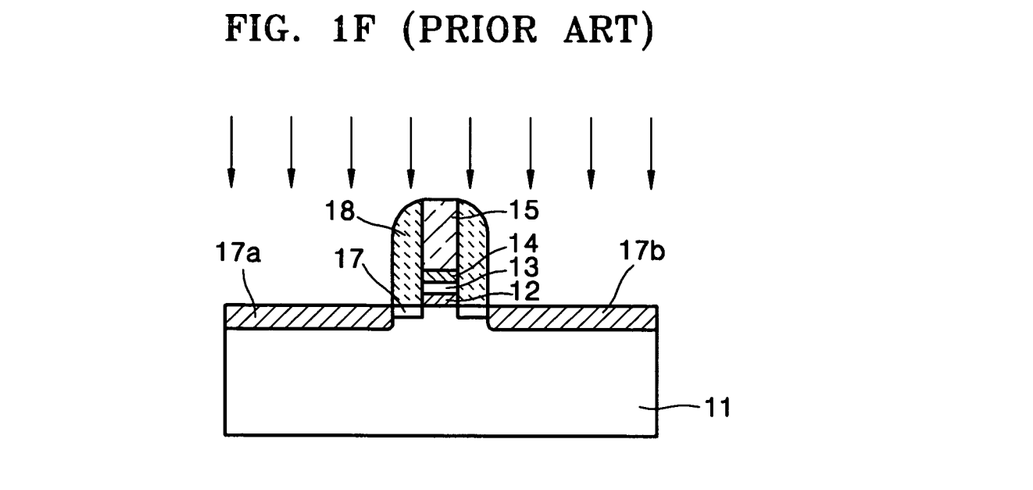
Figure 1G:
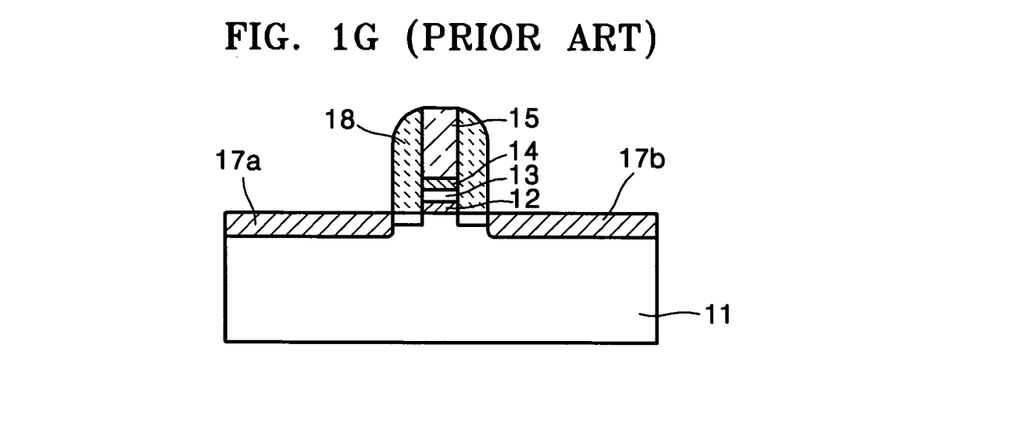
Figure 1H:
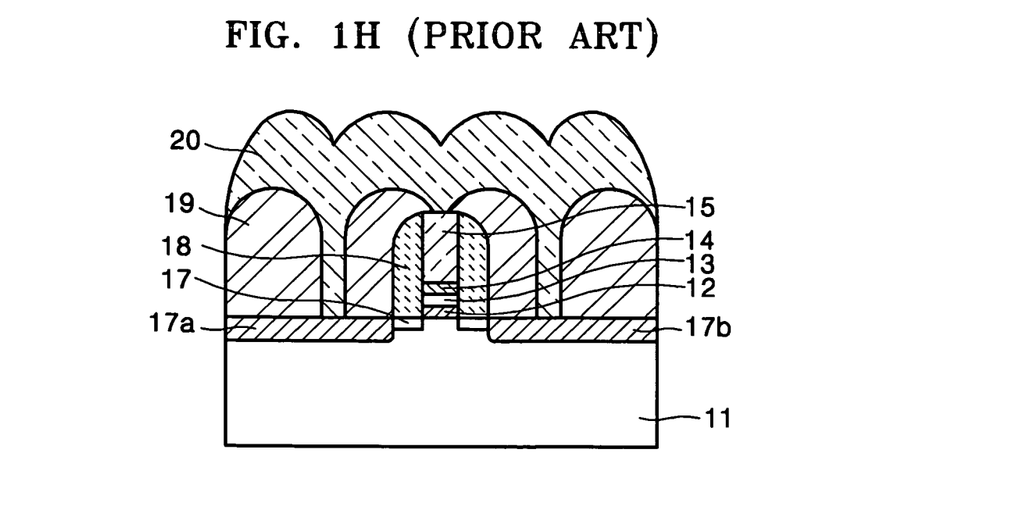

Next, an insulating material is applied onto the semiconductor substrate 11 and both ends of the applied insulating material are etched to obtain the resultant structure of FIG. 1E. More specifically, the insulating layer is etched such that it is formed along the sidewalls of the gate stacked structure as a sidewall layer 18 and regions for the source and drain regions 17a and 17b are exposed. Next, as shown in FIG. 1F, the n-type dopant is further implanted into the regions for the source and drain regions 17a and 17b so as to control the amount of dopant therein and form the regions in desired shapes. Thereafter, annealing is performed on the resultant structure shown in FIG. 1G, thus activating the source and drain regions 17a and 17b. Then, as shown in FIG. 1H, a protective layer 19 is formed on the resultant structure, and a metallization process is performed to form an electrode layer 20 to interconnect the source and drain regions 17a and 17b and the gate electrode layer 15. Later, the electrode layer 20 can be patterned to form the appropriate electrode structure.

A conventional method of fabricating the SONOS memory device, such as that shown in FIGS. 1A through 1H, has the following problems. First, this method is complicated to execute. Namely, a gate electrode layer, which is formed of polysilicon, for example, is etched; an ONO layer is etched; an n-type dopant is implanted; a sidewall layer is deposited and etched; the n-type dopant is further implanted; and annealing is performed on the resultant structure.

Second, a channel region under an oxide layer must be formed to be narrow enough to form a gate stack structure to a width of 100 nm or less and obtain source and drain regions suitable for the gate stack structure. However, since the width of the gate stack structure is narrow, the distance between the source and drain regions may surely become extremely narrow during annealing after the implantation of the n-type dopant, thereby causing the source and drain regions to merge together. Accordingly, more precision for the method is required.

Third, it is difficult to completely etch a tunneling oxide layer since it is formed to a thin thickness of about 20 nm. Thus, it is difficult to implant the n-type dopant into a semiconductor substrate to a desired concentration.

Fourth, a pattern profile must be formed at an angle of about 90 degrees so as to make the distance between the source and drain regions be 100 nm or less. However, in this case, a mask layer must be formed to a thin thickness such that its profile can hardly be affected by the profile of an etching material. Depending on etching conditions, the mask layer may also be etched during the etching the ONO layer after etching the gate electrode layer, thereby remarkably deteriorating the profile of the mask layer. Deterioration of the mask layer profile increases the distance between the source and drain regions, and as a result, it is impossible to obtain any particular effect even if the n-type dopant is implanted into the semiconductor substrate to control the concentration and depth of the source and drain regions.

SUMMARY OF THE DISCLOSURE

Embodiments of the present invention may provide a memory device and a method of fabricating the same using a simplified manufacturing process, thereby increasing the yield and performance of the memory device.

According to an aspect of the present disclosure, there may be provided a method of fabricating a semiconductor memory device, the method comprising (a) forming a gate stack on a semiconductor substrate and partially exposing upper portions of the semiconductor substrate by etching said portions of the gate stack resulting in a gate stack structure, and (b)

implanting a dopant into the exposed portions of the semiconductor substrate to form source and drain regions. The gate stack structure is etched such that its width increases from top to bottom.

Step (a) can include (a1) sequentially forming a first oxide layer, a dielectric layer, a second oxide layer, and a gate electrode layer on the semiconductor substrate; (a2) forming a mask layer on the gate electrode layer and forming a resist pattern to a predetermined width; and (a3) sequentially etching the mask layer, the gate electrode layer, the second oxide layer, the dielectric layer, and the first oxide layer while leaving the resist pattern unetched.

Step (a3) can include (a31) etching the gate electrode layer in an atmosphere of chlorine; and (a32) sequentially etching the gate electrode layer, the second oxide layer, the dielectric layer, and the first oxide layer in an atmosphere of fluorine.

During step (a32), the dielectric layer and the first oxide layer are etched such that its width increases from top to bottom.

The dielectric layer and the first oxide layer can be etched using a reaction ion beam.

During step (a32), the dielectric layer and the first oxide layer can be etched by controlling the concentration of fluorine such that the width of the dielectric layer increases from top to bottom so as to adjust the width of the first oxide layer under the dielectric layer.

Step (b) can include implanting the dopant into the exposed portions of the semiconductor substrate, performing annealing on the semiconductor substrate to stabilize the implanted dopant; and forming a protective layer on the semiconductor substrate, etching the protective layer to partially expose the source and drain regions and a gate electrode layer, and forming an electrode layer.

A resist pattern may be formed to a width of 100 nm or less.

According to another aspect of the present disclosure, there may be provided a memory device including a semiconductor substrate; a gate stack structure formed to a predetermined width on the semiconductor substrate; and source and drain regions are formed in the semiconductor substrate on respective sides of the gate stack structure, contact the gate stack structure, and are doped with a dopant whose polarity is opposite to the polarity of a material for the semiconductor substrate. The width of the gate stack structure increases from top to bottom.

The gate stack structure may be formed to a width of about 100 nm or less.

The width of a dielectric layer can increase toward a first oxide layer.

The dielectric layer can comprise at least one material selected from a group consisting of $Si_3N_4$, $HfO_2$, and HfON.

BRIEF DESCRIPTION OF THE DRAWINGS

The above and other aspects and advantages of particular embodiments of the present invention will become more apparent by describing in detail exemplary embodiments thereof with reference to the attached drawings in which.

DETAILED DESCRIPTION OF THE PREFERRED EMBODIMENTS

Figure 2:
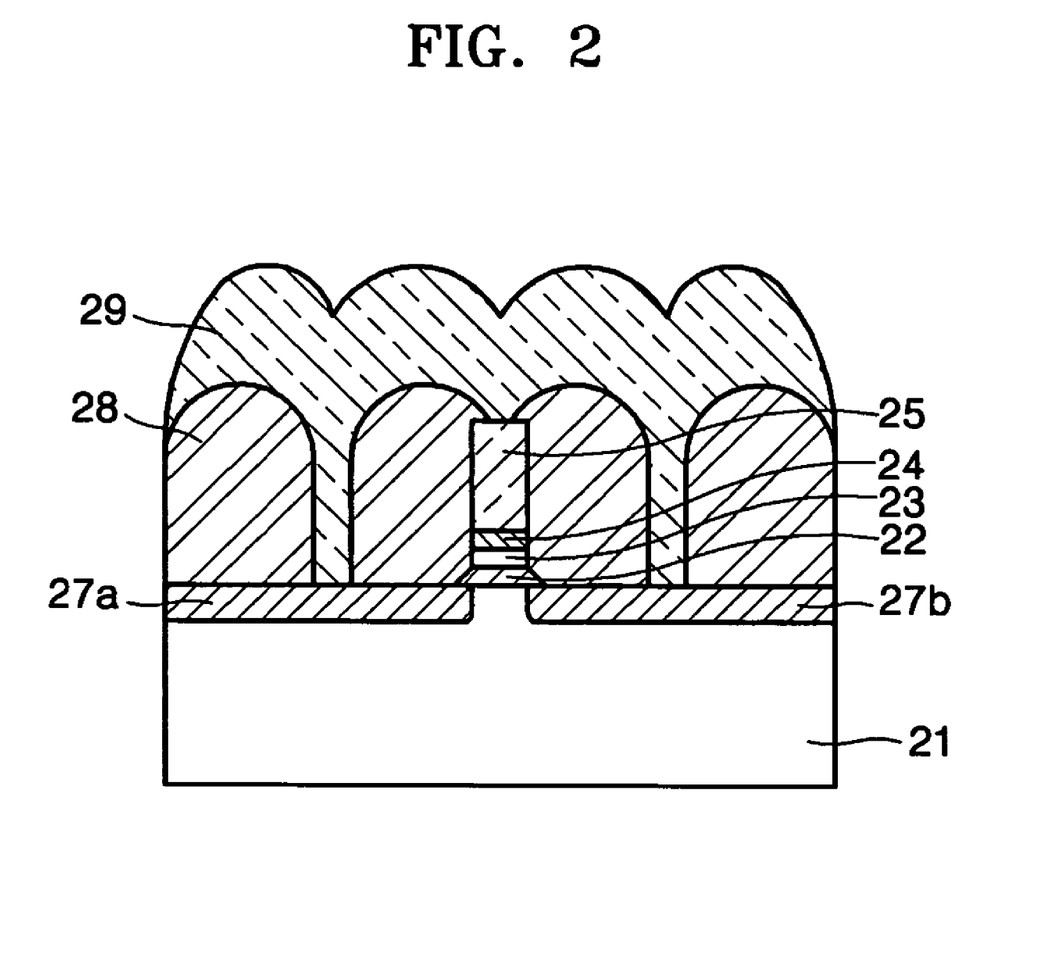
FIG. 2 is a diagram illustrating a memory device according to an embodiment of the present invention.

FIG. 2 illustrates a memory device according to an embodiment of the present invention. Referring to FIG. 2, source and drain regions 27a and 27b are formed in a semiconductor substrate 21. The source and drain regions 27a and 27b are doped with a dopant whose polarity is opposite to that of the semiconductor substrate 21. A gate stack structure is formed on a center portion of the semiconductor substrate 21 that includes parts of the source and drain regions 27a and 27b. The gate stack structure is obtained by sequentially forming a tunneling oxide layer 22, a dielectric layer 23, a blocking oxide layer 24, and a gate electrode layer 25. The tunneling oxide layer 22 contacts the parts of the source and drain regions 27a and 27b, and a channel region is formed under the tunneling oxide layer 22. A protective layer 28 is formed along sidewalls of the gate stack structure and on the source and drain regions 27a and 27b. An electrode layer 29 is further formed on the resultant structure such that it is connected to parts of the source and drain regions 27a and 27b. The electrode layer 29 can then be patterned into individual electrodes.

Similarly to a conventional memory device such as that of FIG. 1H, the memory device of FIG. 2 has a trap site with a predetermined density in the dielectric layer 23. When a predetermined voltage is applied to the gate electrode layer 25, electrons (not shown) are trapped in the trap site via the tunneling oxide layer 22. The blocking oxide layer 24 prevents the electrons from moving to the gate electrode layer 25 when the electrons are trapped in the trap site. Compared to the conventional memory device of FIG. 1H, the memory device of FIG. 2 does not include the sidewall layer 18, and the tunneling oxide layer 22 has a diamond-shaped cross-section. That is, a gate stack structure of a memory device according to one embodiment of the present invention is formed such that its width increases from top to bottom. Accordingly, it is possible to form the gate stack structure to a width of 100 nm or less while preventing the source and drain regions 27a and 27b under the gate stack structure from merging together.

Figure 3A:
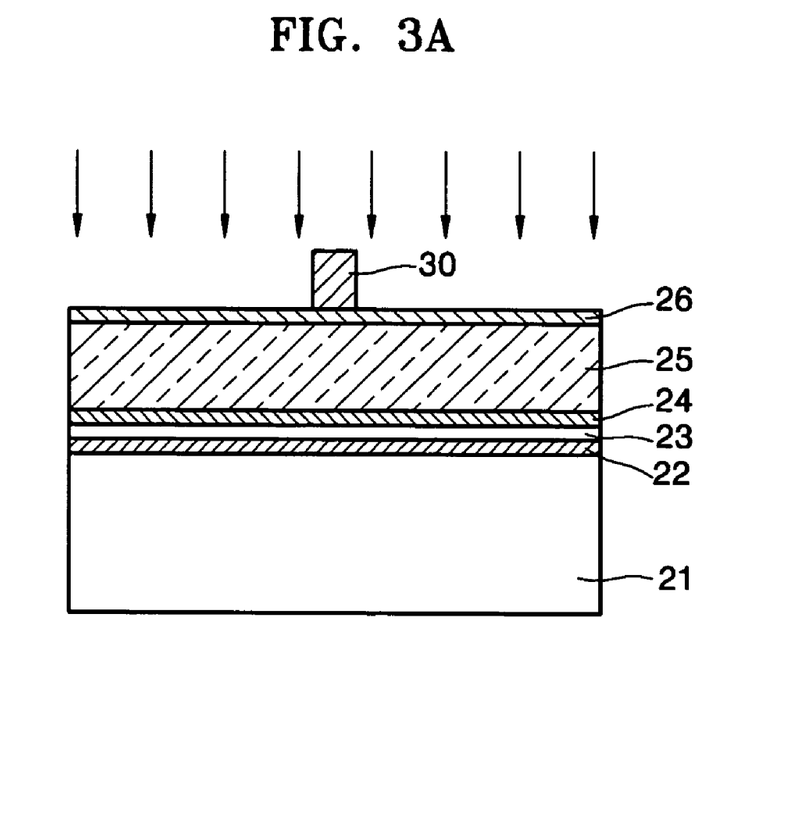
FIGS. 3A through 3F are diagrams illustrating a method of fabricating a memory device according to an embodiment of the present invention.

A method of fabricating a memory device according to an embodiment of the present invention will now be described in greater detail with reference to FIGS. 3A through 3F. Referring to FIG. 3A, a tunneling oxide layer 22, a dielectric layer 23, a blocking oxide layer 24, and a gate electrode layer 25 are sequentially formed on a semiconductor substrate 21, thus forming a gate stack structure. The dielectric layer 23 may include at least one of the dielectric materials used in a memory device, such as $Si_3N_4$, $HfO_2$, and HfON. If the memory device according to one embodiment of the present invention is an SONOS memory device, the tunneling oxide layer 22, the dielectric layer 23, and the blocking oxide layer 24 form an oxide-nitride-oxide (ONO) layer. In this case, the dielectric layer 23 acts as a nitride layer. The type of the semiconductor substrate 21 is not limited. For example, a silicon (Si) substrate or a silicon-on-insulator (SOI) substrate may be used as the semiconductor substrate 21. Further, materials for the gate stack structure are not limited, and thus it may be fabricated with materials used in a conventional method.

In order to make a gate structure, a mask layer 26 is formed on the gate electrode layer 25. Next, an electron beam resist 30 is applied onto the mask layer 26 and patterned to a desired width, e.g., about 100 nm.

Figure 3B:
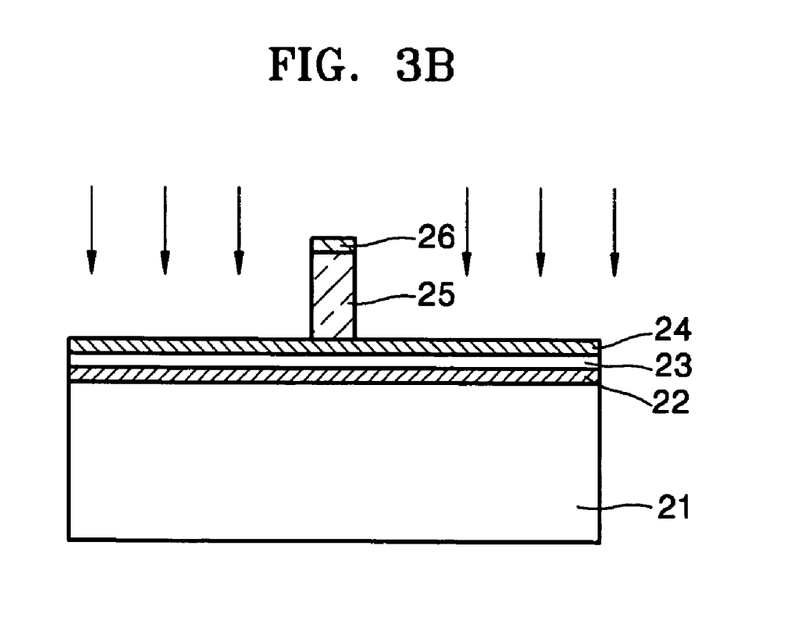

Next, anisotropic etching is performed on the resultant structure of FIG. 3A from above so as to etch the mask layer 26 and the gate electrode layer 25 and remove the electron beam resist 30. As a result, as shown in FIG. 3B, parts of the gate electrode layer 25, which are not in contact with the electron beam resist 30, on the ONO layer are removed, thus exposing parts of the blocking oxide layer 24 that do not contact the gate electrode layer 25. In general, the gate electrode layer 25 is etched while controlling the concentration of chlorine ($Cl_2$) in a chamber with a chlorine ($Cl_2$) atmosphere by supplying argon (Ar) and oxygen ($O_2$) therein. For instance, the gate electrode layer 25 is etched using a reactive ion-beam.

Figure 3C:
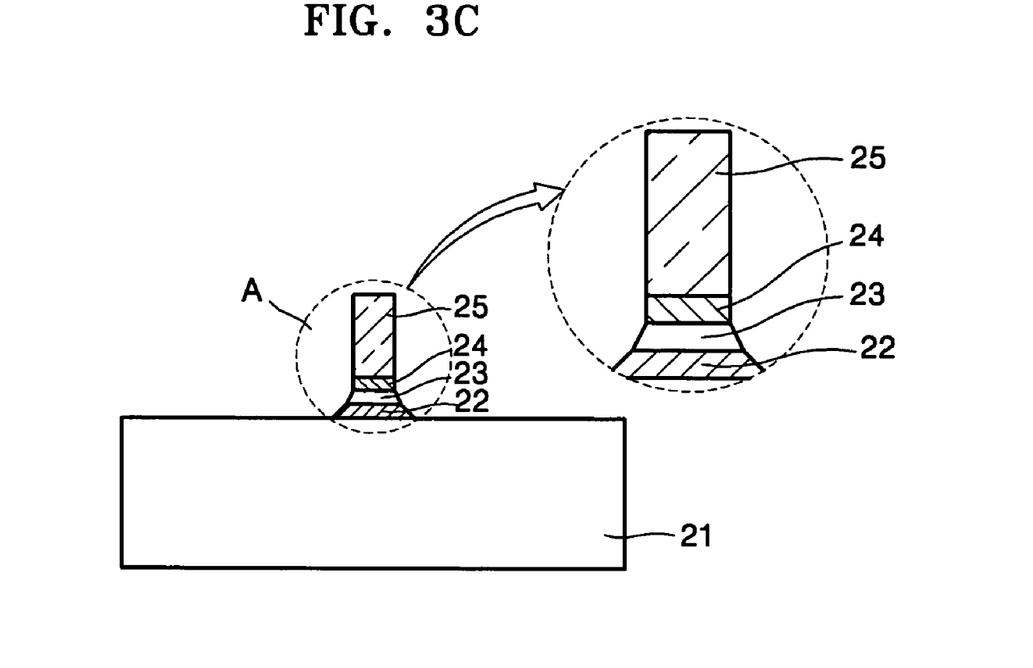

Thereafter, referring to FIG. 3C, both ends of the ONO layer are etched and removed so that the width of the ONO layer is equivalent to that of the gate electrode layer 25. It is possible to etch the ONO layer by adjusting etching conditions such that the dielectric layer 23 and the blocking oxide layer 24 are etched vertically downward but the tunneling oxide layer 24 is etched to a diamond shape. That is, both ends of the tunneling oxide layer 24 can be etched so that they are inclined at predetermined angles. In this case, the ONO layer is etched in a chamber with a fluorine (F) atmosphere where an oxide is generally etched.

Figure 4A:
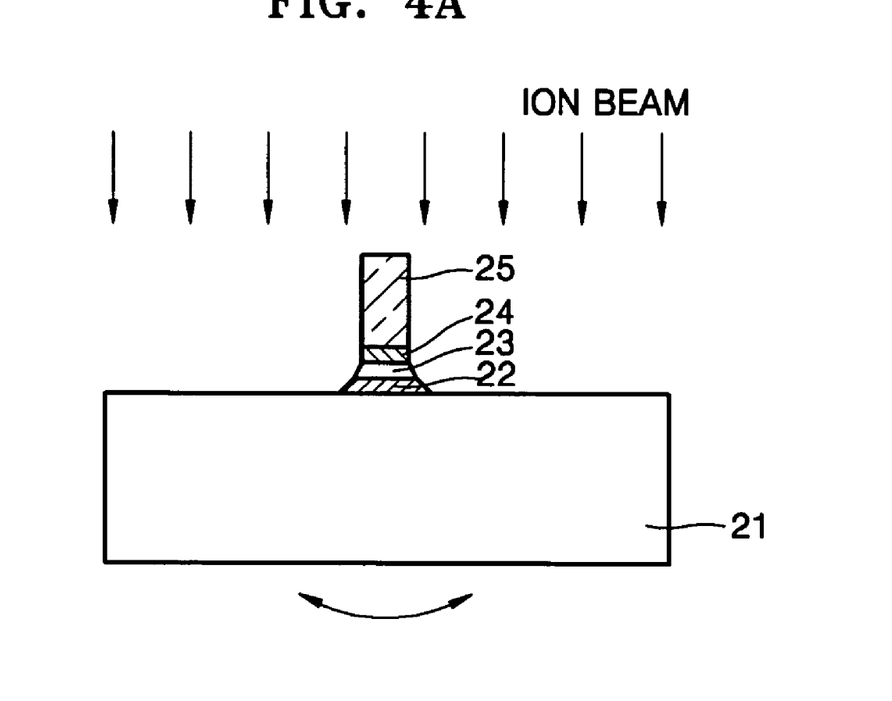
FIGS. 4A and 4B are diagrams illustrating a method of etching a gate stack structure of a memory device according to an embodiment of the present invention.

Unlike a conventional method, according to one embodiment of the present invention, the ONO layer is etched such that the width of the dielectric layer 23 or the tunneling oxide layer 22 increases from top to bottom, compared to the width of the blocking oxide layer 24 or the gate electrode layer 25 on the dielectric layer 23 and the tunneling oxide layer 22. The ONO layer can be etched as described above by adjusting the angle of an incident ion beam during reaction ion-beam etching as shown in FIG. 4A. In other words, it is possible to etch the dielectric layer 23 and/or the blocking oxide layer 24 so that their ends are inclined at a predetermined angle by irradiating the reaction ion-beam onto a test sample holder on which the semiconductor substrate 21 is placed while changing the angle of the ion beam.

Figure 4B:
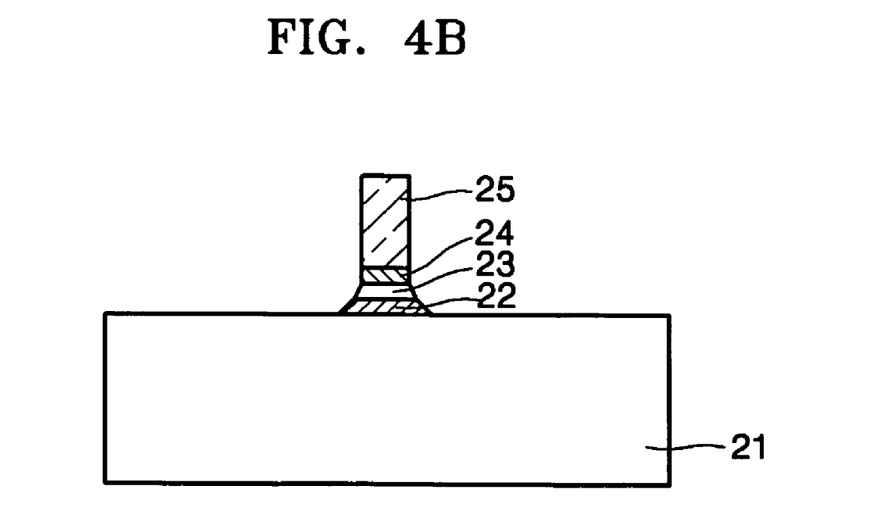

Alternatively, it is possible to etch the ONO layer as described above by adjusting the concentration of fluorine that is generally used as etch gas for an oxide. When using fluorine as an etch gas, an oxide layer is etched at a high speed but a nitride layer is etched at a comparatively low speed. Therefore, as shown in FIG. 4B, the blocking oxide layer 24 is etched downward in the vertical direction. However, the dielectric layer 23, which is a nitride layer, is etched such that its width Decreases from bottom to top, since it is etched at a comparatively low speed when Using fluorine as etch gas. Also, due to the dielectric layer 23, the tunneling oxide layer 22 under the dielectric layer 23 is etched to a similar shape to that of the etched dielectric layer 23. In the case of an SONOS memory device according to one embodiment of the present invention, a gate structure is formed to a width of about 100 nm, and thus it must be etched at a low speed, preferably, 50 Å or less per minute, so as to make the gate structure into a desired shape.

Figure 3D:
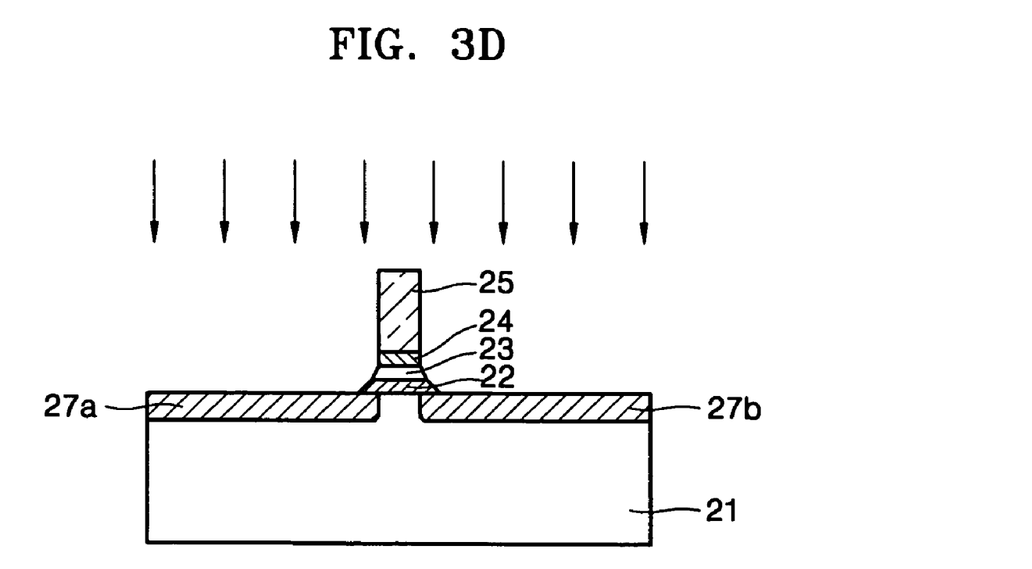

Next, as shown in FIG. 3D, a dopant is implanted into exposed portions of the semiconductor substrate 21 so as to form the source and drain regions 27a and 27b. In a SONOS memory device according to one embodiment of the present invention, the length of a channel between the source and drain regions 27a and 27b is shorter than that of a channel between the source and drain regions 17a and 17b of the conventional SONOS memory device shown in FIG. 1H.

Figure 3E:
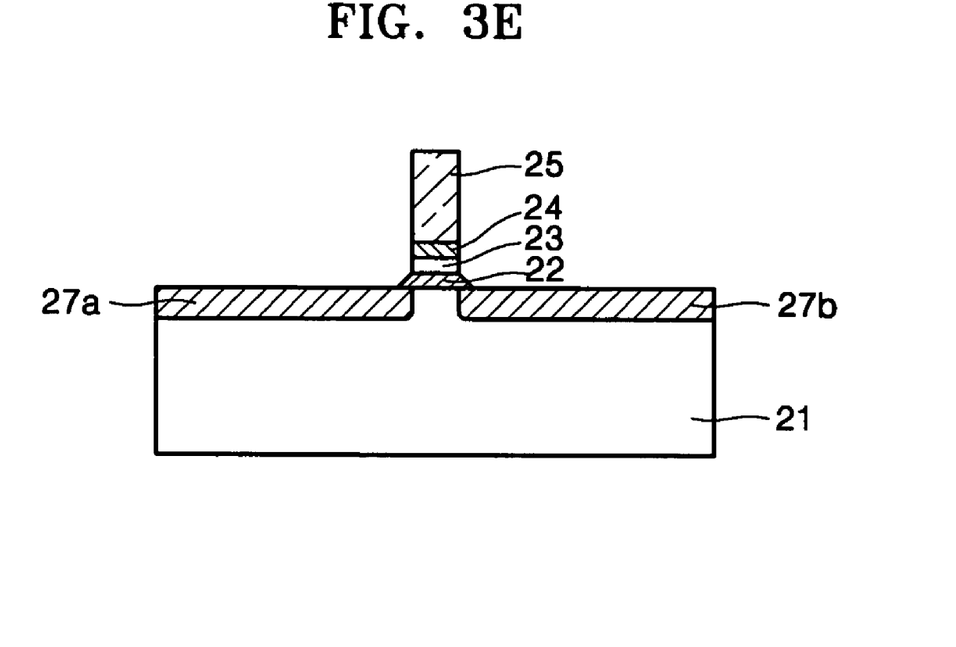

After forming the source and drain regions 27a and 27b, annealing is performed on the resultant structure at a predetermined temperature in order to stabilize the implanted dopant, as shown in FIG. 3E. The predetermined temperature may be about 1000° C. When the dopant is heated at about 1000° C., the dopant is diffused throughout the semiconductor substrate 21. Thus, if the length of a channel between the source and drain regions is short, the source and drain regions may merge together. However, according to one embodiment of the present invention, since the widths of the tunneling oxide layer 22 and/or the dielectric layer 23 increase from top to bottom, they act as a mask when the dopant is implanted Into the semiconductor substrate 21, thereby increasing the length of the channel between the source and drain regions 27a and 27b. Accordingly, it is possible to prevent the source and drain regions 27a and 27b from merging together during annealing.

Figure 3F:
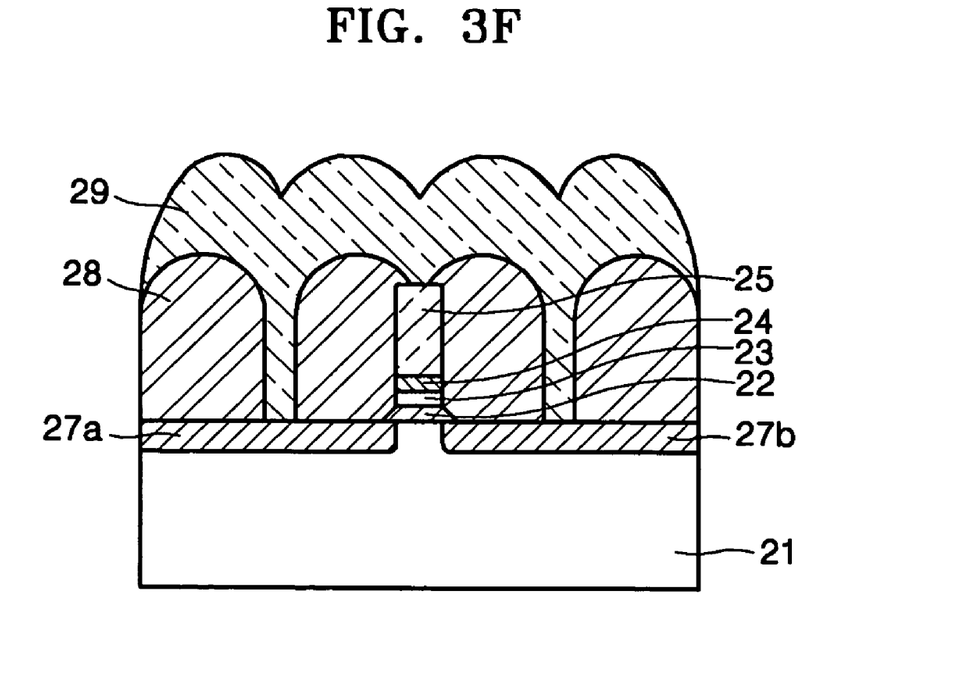

Next, as shown in FIG. 3F, the protective layer 28 is formed on the source and drain regions 27a and 27b and etched to expose parts of the source and drain regions 27a and 27b. Next, metalization is performed on the resultant structure to apply a conductive material thereon to form the electrode layer 29, which is later etched to form the appropriate electrode pattern.

According to embodiments of the present invention, an ONO layer is etched such that a tunneling oxide layer can act as a mask, in place of a sidewall layer, when forming source and drain regions. Further, embodiments of the present invention do not require a dopant to be further implanted into the semiconductor substrate so as to control the amount of dopant in the source and drain regions. Accordingly, it is possible to simplify a process of manufacturing a memory device, thereby reducing manufacture costs and time. Also, a mask layer on a gate electrode layer can be removed during etching the ONO layer, without an additional process.

While this invention has been particularly shown and described with reference to exemplary embodiments thereof, it will be understood by those skilled in the art that various changes in form and details may be made therein without departing from the spirit and scope of the invention as defined by the appended claims. The present invention is applicable to all kinds of semiconductor devices, including a transistor-structure semiconductor device.

What is claimed is:

1. A memory device comprising:
   a semiconductor substrate;
   a gate stack structure formed to a predetermined width on the semiconductor substrate and including a first oxide layer, a dielectric nitride layer, a second oxide layer and a gate electrode layer sequentially positioned directly on the semiconductor substrate, the dielectric nitride layer formed of a uniform material; and
   source and drain regions that are formed in the top surface portion of the semiconductor substrate, contact the gate stack structure, and are doped with a dopant whose polarity is opposite to the polarity of a material for the semiconductor substrate,
   wherein the width of each of the first oxide layer and the dielectric nitride layer of the gate stack structure increase from top to bottom, such that the first oxide layer and the dielectric nitride layer each have an isosceles trapezoidal cross-sectional shape, wherein upper and lower sides are substantially parallel and the other sides are substantially of equal length and congruent base angles, and wherein the base angles of the first oxide layer are smaller than the base angles of the dielectric nitride layer in that the base angles are measured within the isosceles trapezoidal cross-sectional shape between the lower sides and the other sides.

2. The memory device of claim 1, wherein the gate stack structure is formed to a width of about 100 nm or less.

3. The memory device of claim 1, wherein the dielectric nitride layer comprises at least one selected from a group consisting of $Si_3N4$ and HfON.

4. The memory device of claim 1, wherein the dielectric nitride layer comprises HfON.

5. The memory device of claim 1, wherein the dielectric nitride layer includes a trap site for trapping electrons.

6. The memory device of claim 1, wherein the first oxide layer is a tunneling oxide layer and has a trapezoidal-shaped cross-section.

7. A memory device comprising:
a semiconductor substrate;
a gate stack structure including a first oxide layer, a dielectric layer, a second oxide layer and a gate electrode layer sequentially positioned directly on the semiconductor substrate; and
source and drain regions that are formed in the top surface portion of the semiconductor substrate contact the gate stack structure and are doped with a dopant whose polarity is opposite to the polarity of a material for the semiconductor substrate,
wherein the width of the each of the first oxide layer, the dielectric layer, and the second oxide layer of the gate stack structure increase from top to bottom and wherein the dielectric layer is formed of a uniform material, such that the first oxide layer, the dielectric nitride layer and the second oxide layer each have an isosceles trapezoidal cross-sectional shape, wherein upper and lower sides are substantially parallel and the other sides are substantially of equal length and congruent base angles, and
wherein the base angles of the second oxide layer are larger than the base angles of the dielectric nitride layer in that the base angles are measured within the isosceles trapezoidal cross-sectional shape between the lower sides and the other sides.

8. The memory device of claim 7, wherein said dielectric layer comprises at least one selected from a group consisting of, $Si_3N_4$, $HfO_2$, and HfON.

9. The memory device of claim 7, wherein the wherein the base angles of the first oxide layer are smaller than the base angles of the dielectric nitride layer in that the base angles are measured within the isosceles trapezoidal cross-sectional shape between the lower sides and the other sides.

10. The memory device of claim 7, wherein the wherein the base angles of the first oxide layer are smaller than the base angles of the second oxide layer in that the base angles are measured within the isosceles trapezoidal cross-sectional shape between the lower sides and the other sides.

11. The memory device of claim 7, wherein said dielectric layer comprises at least one selected from a group consisting of $Si_3N_4$, $HfO_2$, and HfON.

12. The memory device of claim 7, wherein said dielectric layer comprises $HfO_2$.

13. The memory device of claim 7, wherein said dielectric layer comprises HfON.

14. A memory device comprising:
a semiconductor substrate;
a gate stack structure formed to a predetermined width on the semiconductor substrate and including a first oxide layer, a dielectric nitride layer, a second oxide layer and a gate electrode layer sequentially positioned directly on the semiconductor substrate, the dielectric nitride layer formed of a uniform material; and
source and drain regions that are formed in the top surface portion of the semiconductor substrate, contact the gate stack structure, and are doped with a dopant whose polarity is opposite to the polarity of a material for the semiconductor substrate,
wherein the width of the first oxide layer of the gate stack structure increases from top to bottom, such that the first oxide layer has an isosceles trapezoidal cross-sectional shape, wherein upper and lower sides are substantially parallel and the other sides are substantially of equal length and congruent base angles, and
wherein the width of the second oxide layer is substantially the same throughout the height of the second oxide layer.

15. The memory device of claim 14, wherein the width of each of the first oxide layer and the dielectric nitride layer of the gate stack structure increase from top to bottom, such that the first oxide layer and the dielectric nitride layer each have an isosceles trapezoidal cross-sectional shape, wherein upper and lower sides are substantially parallel and the other sides are substantially of equal length and congruent base angles.

16. The memory device of claim 14, wherein the width of the first oxide layer of the gate stack structure increases from top to bottom, such that the first oxide layer has an isosceles trapezoidal cross-sectional shape, wherein upper and lower sides are substantially parallel and the other sides are substantially of equal length and congruent base angles, and
wherein the base angles of the first oxide layer are smaller than the base angles of the dielectric nitride layer in that the base angles are measured within the isosceles trapezoid cross-sectional shape between the lower sides and the other sides.

17. The memory device of claim 14, wherein the width of the dielectric layer is substantially the same throughout the height of the second oxide layer.

18. The memory device of claim 14, wherein said dielectric layer comprises at least one selected from a group consisting of $Si_3N_4$, $HfO_2$, and HfON.

19. The memory device of claim 18, wherein said dielectric layer comprises $HfO_2$.

20. The memory device of claim 18, wherein said dielectric layer comprises HfON.

* * * * *